United States Patent Office 3,252,874

Patented May 24, 1966

3,252,874
PHOTOSENSITIVE SHEETS, THE PREPARATION AND USE THEREOF

Franklin A. Hamm, Stillwater, and Richard L. Weiher, St. Paul, Minn., assignors to Minnesota Mining and Manufacturing Company, St. Paul, Minn., a corporation of Delaware No Drawing. Filed Oct. 23, 1959, Ser. No. 848,219
7 Claims. (Cl. 204—18)

This invention relates to the formation of permanent reproductions of light images on light sensitive surfaces by methods involving electrolysis at the exposed light sensitive surfaces. In one aspect, this invention relates to the use of photoconductive indium oxide in the reproduction of visible images. In another aspect, this invention relates to a novel photosensitive copysheet capable of electrolytic development. In yet another aspect, this invention relates to a novel photosensitive copysheet containing a photoconductive material which can be visibly developed by electrolytic reduction.

The use of photosensitive sheet materials having surface layers which become more electrically conductive when irradiated with light of certain wave lengths is known. Thus, a photoconductive material such as zinc oxide can be coated on a sheet of electrically conductive material, exposed to a light image, and subjected to electrolysis in the presence of various electrolytically reducible developer solutions, such as an aqueous silver nitrate solution, the electrically conducting material serving as the cathode. The differential conductivity pattern produced by illumination with the light image is thereby electrolytically developed by reduction of the developer material to form a visible reproduction of the original light image. This process is described in greater detail in S.N. 575,070, filed March 30, 1956, now Patent No. 3,010,883. However, the process is subject to certain limitations which have provided the impetus for further study and investigation. It has been found, for example, that many materials which are known photoconductors, such as selenium, zinc sulfide, cuprous oxide, anthracene, and flowers of sulfur, are unsuitable for use in the above electrolytic image forming process.

It is therefore an object of this invention to provide a novel photosensitive copysheet for the reproduction of images.

It is another object of this invention to provide a novel photosensitive copysheet which is particularly useful for the reproduction of images in electrolytic processes.

Still another object of this invention is to provide a novel photosensitive copysheet containing an electrolytically reducible photoconductive material.

Yet another object of this invention is to provide a process for producing a permanent, stable, high contrast image on an exposed photoconductive surface.

One other object is to provide a simple, economical process for producing a visible image on a photocnductive copysheet by electrolytic development at low voltages.

A further object of this invention is to provide an essentially dry process for developing an image on a photoconductive copysheet.

It is also an object of this invention to provide a novel photosensitive copysheet which has a photoconductive response varying in a positive manner with exposure, a comparatively short rise time and a comparatively long decay time for the photoconductivity.

Various other objects and advantages will become apparent to those skilled in the art from the accompanying description and disclosure.

According to this invention, the novel receptor sheet or photosensitive sheet which is exposed to light contains an electrically conductive base, such as metal foil, metal plate, etc. upon which a contiguous layer of indium oxide is placed or bonded. In bonding the indium oxide to the electrically conductive base various water resistant, flexible film forming polymeric binders can be used, provided the polymer does not adversely affect the light sensitivity of the photoconductive material, and is an insulating material relative to indium oxide. Such organic polymers include a 30:70 mole ratio copolymer of butadiene and styrene (Pliolite S–7 solution, 30 weight percent solution in toluene), polystyrene, chlorinated rubber, rubber hydrochloride, etc. Polymers which are dissolved or softened by water, or which are dark in color, or insoluble in commercial solvents, or which readily wet indium oxide particles, are generally not preferred. Thus, polyvinyl alcohol, polyacrylic acid, shellac and sodium carboxymethyl cellulose are generally not preferred as binders for indium oxide.

Metal foil or sheet provides a suitable electrically conductive backing. Metal conductors, such as aluminum, chromium, nickel and copper are suitable for such a backing and may additionally be placed on the surface of a non-conductive supporting sheet, e.g. by lamination, etc. Electrically conductive glass, paper, plastic, etc. can also be used as a backing or support. Flexible backings are preferred.

The photoconductive coating composition is prepared by first mixing together the indium oxide powder and the binder material, preferably in a solvent for the binder. Various ratios of indium oxide and resinous binder may be employed, although significant variations in the effectiveness of the copysheet in electrolytic image development are observed. Generally, the optimum ratio of indium oxide to binder varies somewhat with the choice of binder. Thus, particularly when a binder such as a 30:70 butadiene-styrene copolymer is employed, the weight ratio of pigment to binder ranges from about 4:1 to about 8:1, with optimum results obtained at a ratio of about 6:1. Before coating the indium oxide-binder mixture on the electrically conductive backing it is essential to provide an intimate suspension of the binder and indium oxide in a volatile solvent for the binder, such as by an extended period of ball milling. The amount of volatile solvent, e.g. toluene, ethyl acetate, etc., is controlled to prevent gelling and to provide a viscous spreadable suspension which is smooth and free of lumps on coating. Dry coating thicknesses usually range from about 0.5 to 10 microns with a preferable thickness of from 1.5 to 3.5 microns.

The effectiveness of any pigment-binder mixture as a photosensitive layer on an electrically conductive backing is directly related to the intimacy of the suspension. Thus, when a 6:1 ratio of indium oxide powder (particle size of about 5 microns and below) and Pliolite S–7, containing approximately 18 grams $In_2O_3$, 10 grams Pliolite S–7 solution, and 60 ml. of toluene was ball milled in a small laboratory ball mill for various lengths of time, it was observed that the bulk dark conductivity of a film therefrom coated on aluminum substrate varied from about $10^{-5}$ mho/cm. after several hours to about $10^{-8}$ mho/cm. after 144 hours of ball milling, a decrease in dark conductivity of about three orders of magnitude. The test procedures followed, hereinafter referred to as the Standard Wet Test, included coating an aluminum laminated paper with a 5–6 mil coating (wet thickness) of the above suspension, drying, dark adapting the coated sheet for at least 24 hours, and measuring the dark current of a 1.13 $cm.^2$ area at 9.25 volts D.C. with 1 molar $(NH_4)_2SO_4$ Exposure was made at a light intensity of 1300 foot-candles from a tungsten source at 3200° K. for 30 seconds. The symbols $i_d$ and $i_{30}$ as used herein refer respectively to the current flow under dark conditions and to the increase in current flow (i.e. photocurrent) after a 30 second exposure to the above recited Standard Wet Test conditions. Results appear in Table I. Ethyl acetate replaced toluene as the volatile solvent in run 14.

*Table I*

| Sample | Ball Mill Time | Current, amps | | $i_{30}/i_d$ |
|---|---|---|---|---|
| | | $i_d$ ark | $i_{30}$ sec. | |
| 1 | 24 hours | $18\times10^{-2}$ | $45\times10^{-2}$ | |
| 2 | do | $18\times10^{-2}$ | $39\times10^{-2}$ | 2.3 average. |
| 3 | 48 hours | $9\times10^{-2}$ | $29\times10^{-2}$ | |
| 4 | do | $7\times10^{-2}$ | $25\times10^{-2}$ | 3.4 average. |
| 5 | 72 hours | $4\times10^{-2}$ | $15\times10^{-2}$ | |
| 6 | do | $2.5\times10^{-2}$ | $12\times10^{-2}$ | 4.2 average. |
| 7 | 96 hours | $1.3\times10^{-2}$ | $5\times10^{-2}$ | |
| 8 | do | $.9\times10^{-2}$ | $4.1\times10^{-2}$ | 4.1 average. |
| 9 | 120 hours | $6.5\times10^{-3}$ | $3.1\times10^{-2}$ | |
| 10 | do | $8.0\times10^{-3}$ | $4.1\times10^{-2}$ | 5.0 average. |
| 11 | 144 hours | $3.5\times10^{-4}$ | $9.0\times10^{-3}$ | |
| 12 | do | $8.7\times10^{-4}$ | $11.3\times10^{-3}$ | |
| 13 | do | $4.4\times10^{-4}$ | $8.3\times10^{-3}$ | 17.1 average. |
| 14 | 300 hours | $3.0\times10^{-8}$ | $3.01\times10^{-6}$ | 100. |

Both the light current and the dark current decrease with extended wet comminution, such as by milling. However, although the light current ($i_{30}$) decreases with ball milling time, it decreases at a lesser rate than the dark current ($i_d$, thereby increasing the ratio of light to dark current. For use as a photoconductive copysheet in the reproduction of light images the $i_{30}/i_d$ ratio should be sufficiently high so as to provide contrast between light and dark areas. Ratios above about 2.5, preferably above about 5, have proven satisfactory. Exceptional images have been produced with the copysheets herein described having $i_{30}/i_d$ values of about 20 or higher. When lower values of $i_{30}/i_d$ are employed, the contrast between light and dark areas of the print is unsatisfactory and the copysheet is generally unsuitable for use in electrolytic image development. When the dark conductivity is more than about $10^{-7}$ mho/cm., the photocurrent is low and the background areas of the print tend to darken under ordinary electrolytic development conditions.

Although the actual mechanism operating to increase the ratio of $i_{30}/i_d$ is not fully understood, it is believed that the major contributing factors are the intimacy of the suspension and the indium oxide particle size. Indium oxide is available commercialy in powder form, usually pale yellow in color, and is produced by various techniques, e.g. burning indium metal in air or oxygen, heating $In(OH)_3$ to remove water, etc. Since the photoconductive properties of the indium oxide vary somewhat with its method of preparation, often varying among several lots from a single supplier, it is generally found desirable to determine the optimum pigment-binder mixture by preparing small sample lots of various pigment-binder ratios, adding a measured quantity of volatile solvent thereto to provide a suitable suspending medium, and ball milling the mixtures. As the ball milling operation proceeds, portions of the coating suspension are withdrawn at regular intervals and are applied to an electrically conductive backing, e.g. aluminum foil, then tested with a procedure similar to the described above in conjunction with Table I. The ball milling time in a laboratory mill can be varied greatly, but periods of 72 hours and longer are preferable for optimum photosensitivity, i.e. maximum $i_{30}/i_d$ ratio. It is, of course, to be understood that the total time requirement is dependent on the ball milling conditions, such as number of balls, type of balls, rate of drum revolution, etc.; hence, the above test procedures should be selected insofar as possible to approximate plant operating conditions to determine optimum ball milling time.

The use of sensitizing dyes broadens the spectral response of indium oxide in much the same manner as with zinc oxide, and small quantities of these dyes, e.g. 0.02–0.08 gm. dye per 120 grams of indium oxide, either alone or in mixtures, increase the rate of response and the ratio of light conductivity to dark conductivity by a factor of 4 or more. The example below will illustrate the effect of dye sensitization.

The following mixture was ball milled in a 10 cm. glass jar containing 1 cm. diameter ceramic balls which are added to the jar until they reach the surface of the mixture. The jars were rolled at about 60 r.p.m. for a period of 120 hours, containing the following recipe:

50 grams of 6:1 weight ratio of $In_2O_3$ to Pliolite S–7 copolymer (30 weight percent solids in toluene)
60 ml. of toluene
10 drops of Patent Blue (C.I. 672)
10 drops of Phosphine R (C.I. 788)
10 drops of xylene cyanol (C.I. 715)

This suspension was then coated at various thicknesses on aluminum laminated paper and allowed to dry for 72 hours. These films were tested by the Standard Wet Test (1 mol $(NH_4)_2SO_4$ electrolyte, 9.3 volts D.C., 1.13 cm.$^2$ area, light intensity of 1300 foot-candles from a tungsten source at 3200° K.), the results appearing in Table II. Samples 16 and 17 were prepared without dye for purposes of comparison.

*Table II*

| Sample | Wet Coating Thickness | Amps | | $i_{30}/i_d$ | Dry Film Thickness |
|---|---|---|---|---|---|
| | | $i_d$ | $i_{30}$ | | |
| 1 | 10 mil | $1.4\times10^{-3}$ | $29\times10^{-3}$ | | |
| 2 | do | $1.0\times10^{-3}$ | $19\times10^{-3}$ | | |
| 3 | do | $0.8\times10^{-3}$ | $10\times10^{-3}$ | 17.5 average | $1.78\times10^{-3}$ cm. |
| 4 | 8 mil | $1.4\times10^{-3}$ | $25\times10^{-3}$ | | |
| 5 | do | $2.0\times10^{-3}$ | $45\times10^{-3}$ | | |
| 6 | do | $1.6\times10^{-3}$ | $34\times10^{-3}$ | 20.4 average | $1.08\times10^{-3}$ cm. |
| 7 | 6 mil | $6.0\times10^{-3}$ | $10\times10^{-2}$ | | |
| 8 | do | $4.0\times10^{-3}$ | $7\times10^{-2}$ | | |
| 9 | do | $5.0\times10^{-3}$ | $8\times10^{-2}$ | 16.6 average | $0.99\times10^{-3}$ cm. |
| 10 | 4 mil | $23.0\times10^{-3}$ | $13\times10^{-2}$ | | |
| 11 | do | $20.0\times10^{-3}$ | $22\times10^{-2}$ | | |
| 12 | do | $10.0\times10^{-3}$ | $12\times10^{-2}$ | 9.0 average | $0.60\times10^{-3}$ cm. |
| 13 | 2–5 mil | $3.0\times10^{-3}$ | $4.5\times10^{-2}$ | | |
| 14 | do | $5.0\times10^{-3}$ | $4.7\times10^{-2}$ | | |
| 15 | do | $1.0\times10^{-3}$ | $3.2\times10^{-2}$ | 13.7 average | $1.44\times10^{-3}$ cm. |
| 16 | (No dye) | $6.5\times10^{-3}$ | $3.1\times10^{-2}$ | | |
| 17 | do | $8.0\times10^{-3}$ | $4.1\times10^{-2}$ | 5.0 average | $1.04\times10^{-3}$ cm. |

Although the use of a binder to permanently affix the indium oxide onto the electrically conductive backing is preferred, it is also within the scope of this invention to apply an indium oxide film directly onto the conductive backing without a binding agent. Thus, a 3 cm. wide strip of NESA glass having a conductive surface layer was exposed to indium oxide vapor produced by burning indium metal in an air atmosphere. A 1.4 inch band of the conductive film on the NESA glass surface, extending the full width of the surface, had been removed with sandpaper. After the thin film of indium oxide had been deposited on the sandpapered non-conductive NESA glass band, the photo-conductivity of the sample was measured with the following technique. Using the NESA glass conductive portions on both sides of the induim oxide strip as electrodes, a direct current potential of 100 volts was impressed across the ¼ inch indium oxide coating and the current flow was measured under dark conditions and again after a 30 second exposure to a light intensity of 650 foot-candles from a tungsten source at 3200° K. The dark current passed was $2\times10^{-7}$ amps and the $i_{30}/i_d$ ratio was 19.6. Such indium oxide films can be vapor deposited on metal sheet or foil and other suitable electrically conductive backing materials, including NESA glass, and can be used for image reproduction by employing the "dry" developing methods hereinafter described. Where binders are not employed, the developed image can be made more permanent by "fixing" the print, as by spraying with a transparent film-forming material or binder.

The photoconductivity of indium oxide film increases almost linearly with exposure time, even after 5 minutes of exposure to a light intensity of 1300 foot-candles from a tungsten source at 3200° K. Using the Standard Wet Test procedure, the ratio of light to dark conductivity also increases linearly over this range of exposure time, attaining a value of about 100 after 5 minutes' exposure at an applied voltage of 4.0 volts D.C. A very low decay rate of photoconductivity is also noted.

The photoconductive copysheet of this invention can be exposed to a light image and be developed either simultaneously or subsequently thereto by electrolytic techniques. It is a particularly preferred embodiment of this invention to use the copysheets herein described in the electrolytic process, discussed earlier, since the development voltage or electrolysis voltage may be as low as about 3 volts D.C. or lower but is generally above about 10 volts D.C. Alternating current can also be used for electrolytic development. Suitable electrolytically reducible developers, e.g. aqueous solutions of silver salts, leuco dyes, nickel salts, etc., and indicator dyes, e.g. Malachite Green, Methyl Red, Thymol Blue, Alizarine Red S, etc., can be employed to develop the visible image. These developers may also be incorporated on or in the indium oxide surface layer of the photoconductive sheet and developed in situ. They may be contained in a relatively transparent layer of a fusible solid surface layer, such as gelatine, superimposed on the indium oxide layer, electrolysis being accomplished by passing a metal bar or roll, heated if desired, connected as the anode, over the fusible surface layer. This provides a method of "dry" development. The development techniques described in U.S. S.N. 575,070, filed March 30, 1956, may also be employed. The following example illustrates one "wet" development technique.

The copysheet of Sample 10 in Table I was dark adapted and exposed to a light image (contact print), using an ordinary 300 watt bulb positioned approximately one foot from the copysheet as the source of incident light. Exposure time was 30 seconds. The image was developed with a sponge soaked with the following developer solution:

| | weight percent |
|---|---|
| $AgNO_3$ | 1 |
| Acetamide | 1 |
| Citric acid | 1 |
| Thiourea | 2 |
| Water | 95 |

The electrically conductive backing of the copysheet was connected as the cathode and the soaked sponge was connected as the anode. With 20 volts D.C. a good contrast image was formed with one rapid pass of the sponge over the exposed surface.

It is a particularly preferred embodiment of this invention to develop the indium oxide containing copysheet without the use of additional electrolytically reducible developers. Such electrolytic development of the image bearing copysheet results from the reduction of indium oxide to indium metal, which is dark brown or black in color, in the light struck areas. Thus the photoconductive indium oxide itself serves as the electrolytically developable material. Although the development still requires electrolysis and the passage of current selectively through the light exposed portions of the indium oxide coating, any electrolyte or current-conducting ion-containing medium, including ordinary tap water, can be employed. The passage of an electrical charge as low as 150 millicoulombs per square centimeter serves to effectively reduce indium oxide and provide a diffuse reflected density of 1.0.

By obviating the necessity for an added developer material, the indium oxide containing copysheet of this invention permits development procedures which are not only greatly simplified but which produce high contrast, extremely stable images at low electrolysis voltages. It also eliminates the problem of stability, not only of the image but also of the developer solutions heretofore necessary with zinc oxide containing copysheets. This makes it feasible to use a battery operated portable unit which is light in weight and simple to operate, a particularly useful embodiment where no external source of electrical power is available.

Because of the relatively low photoconductivity decay rate, the indium oxide copysheets of this invention possess a "light memory" that permits retention of information for longer periods of time than heretofore possible with photoconductive materials such as zinc oxide. In general, these indium oxide copysheets are not recommended for use in xerographic processes due to their relative inability to build up and maintain a surface charge.

A still further novel feature of the indium oxide copysheets of this invention resides in the erasability of the indium metal image. Erasure can be effected by treating the print with acid, such as concentrated nitric acid, which dissolves the indium metal without affecting the unreduced indium oxide. Copysheets so erased can be reused by repeated exposure and electrolytic development.

In an illustrative run the following mixture was ball milled for 72 hours in the laboratory ball mill apparatus and under the same conditions earlier described:

| | | |
|---|---|---|
| $In_2O_3$ | grams | 18 |
| 30 weight percent Pliolite S–7 in toluene | do | 10 |
| Toluene | cc | 60 |

The resulting suspension was coated 5 mils wet on aluminum laminated paper. After the coated paper was dry and had been dark adapted it was exposed to a light image (intensity of 500 foot-candles from a tungsten source at a temperature of 3200° K. for 30 seconds). Using a sponge which contained 1 molar $(NH_4)_2SO_4$ and which was connected as anode, a voltage of 22 volts D.C. was applied between the sponge and the aluminum backing, the latter serving as cathode. A dense, high contrast black image was formed which was highly stable and unaffected by boiling for 15 minutes in both water at 100° C. and a NaCl solution at 105° C. No "fixing" or washing is required. A similar image was placed in an atmosphere at 76% relative humidity and 80° C. for 120 hours with little noticeable effect. Samples exposed to window light for 5 days and to artificial light for about 30 days also showed no observable change. Similar results were obtained with "dry" techniques by using a gelatin coated metal roller connected as the anode. In still another modification, the transparent gelatin coating can be superimposed on the indium oxide containing layer, electrolytic development being accomplished by using a metal roller as the anode.

In a most preferred embodiment of this invention, therefore, a photoconductive receptor sheet containing a light sensitive indium oxide coating on a contiguous electrically conductive backing, which receptor sheet has an $i_{30}/i_d$ ratio of at least about 2.5, is exposed to a light image and is electrolytically developed by connecting the electrically conductive backing as cathode and contacting the indium oxide coating with an electrolyte, the electrolyte being in electrical contact with an anode, thereby passing current through the light exposed portions of the indium oxide coating.

Various other alterations and modifications of the present invention will be apparent to those skilled in the art without departing from the scope of this invention.

We claim:

1. A process for the reproduction of a light image which comprises exposing to said light image a photoconductive receptor sheet containing a photoconductive indium oxide coating on a contiguous electrically conductive backing, said receptor sheet having an $i_{30}/i_d$ ratio of at least abont 2.5 and being essentially incapable of buiding up and maintaining a surface charge, and electrolytically developing said sheet by passing current selectively through the light exposed portions of the indium oxide coating.

2. A process for the reproduction of a light image which comprises exposing to said light image a receptor sheet containing a photoconductive indium oxide coating on a contiguous electrically conductive backing, said receptor sheet having an $i_{30}/i_d$ ratio of at least about 2.5 and being essentially incapable of building up and maintaining a surface charge, and electrolytically developing said sheet while contacting said indium oxide coating with an electrolyte containing an electrolytically reducible material as a developer and passing current through the light exposed portions of the indium oxide coating.

3. A process for the reproduction of a light image which comprises exposing to said light image a photoconductive receptor sheet containing a photoconductive coating comprising $In_2O_3$ on a contiguous electrically conductive backing, said receptor sheet having an $i_{30}/i_d$ ratio of at least about 2.5 and being essentially incapable of building up and maintaining a surface charge, and electrolytically developing said sheet by passing current selectively through the light exposed portions of said coating, thereby producing a visible image having free indium in said image areas.

4. A process for the reproduction of a light image which comprises exposing to said light image a photoconductive receptor sheet containing a photoconductive coating of $In_2O_3$ and an electrically insulating film-forming binder on a contiguous electrically conductive backing, said receptor sheet having an $i_{30}/i_d$ ratio of at least about 2.5 and being essentially incapable of building up and maintaining a surface charge, and electrolytically developing said sheet while contacting said sheet $In_2O_3$ coating with an aqueous electrolyte and passing current selectively through the light exposed portions of the $In_2O_3$ coating.

5. A copysheet having an $i_{30}/i_d$ ratio of at least about 20 and being essentially incapable of building up and maintaining a surface charge which comprises a coating of photoconducitve indium oxide intimately dispersed in an organic polymeric binder, the weight ratio of binder to indium oxide being about 1:6 on a contiguous electrically conductive backing, said coating containing a gelatin layer superimposed thereon.

6. A light exposed copysheet having an $i_{30}/i_d$ ratio of at least about 2.5 and being essentially incapable of building up and maintaining a surface charge and containing thereon a stable image which comprises a coating of photoconductive indium oxide on a contiguous electrically conductive backing, the exposed surface of said indium oxide coating containing an electrolytically reduced developer material in the light exposed areas.

7. A light exposed copysheet having an $i_{30}/i_d$ ratio of at least about 2.5 and being essentially incapable of building up and maintaining a surface charge and containing thereon a stable image which comprises a coating of photoconductive indium oxide powder and an organic polymeric binder on a contiguous electrically conductive backing, the surface of said coating containing indium metal in the light exposed areas.

References Cited by the Examiner

UNITED STATES PATENTS

| | | | |
|---|---|---|---|
| 2,423,624 | 7/1947 | Smart | 204—45 |
| 2,862,815 | 12/1958 | Sugarman et al. | 96—1 |
| 2,866,903 | 12/1958 | Berchtold | 96—1 |
| 3,010,883 | 11/1961 | Johnson et al. | 204—18 |

FOREIGN PATENTS

| | | |
|---|---|---|
| 151,971 | 5/1904 | Germany. |
| 188,030 | 10/1922 | Great Britain. |
| 215,754 | 6/1958 | Australia. |
| 464,112 | 4/1937 | Great Britain. |

OTHER REFERENCES

Yates: Radio-Craft, March 1943, p. 334.

JOHN H. MACK, *Primary Examiner.*

MILTON STERMAN, JOSEPH REBOLD, JOHN R. SPECK, *Examiners.*

J. E. ALIX, R. GOOCH, T. TUFARIELLO, *Assistant Examiners.*